United States Patent [19]

Inoue

[11] Patent Number: 4,976,839
[45] Date of Patent: Dec. 11, 1990

[54] METHOD OF FORMING A BARRIER LAYER BETWEEN A SILICON SUBSTRATE AND AN ALUMINUM ELECTRODE OF A SEMICONDUCTOR DEVICE

[75] Inventor: Minoru Inoue, Kawasaki, Japan

[73] Assignee: Fujitsu Limited, Kawasaki, Japan

[21] Appl. No.: 383,511

[22] Filed: Jul. 24, 1989

[30] Foreign Application Priority Data

Jul. 25, 1988 [JP] Japan ................. 63-185005

[51] Int. Cl.$^5$ .............. C23C 14/04; C23C 14/06; C23C 14/08
[52] U.S. Cl. .................. 204/192.17; 357/71
[58] Field of Search ............. 204/192.17, 192.22; 357/71

[56] References Cited

U.S. PATENT DOCUMENTS 4,783,248 11/1988 Kohlhase et al. ............. 204/192.17

OTHER PUBLICATIONS

Lee, B. et al., "Effect of Oxygen on the Diffusion Barrier Properties of Tin." *Proceedings of the Fourth International IEEE VLSI Multilevel Interconnect Conference*, (Santa Clara, Calif., 15th-16th Jun. 1987), pp. 344-350.
Wittmer, Marc, "Properties and Microelectronic Applications of Thin Films of Refractory Metal Nitrides." *Journal of Vacuum Science & Technology*, vol. 3, No. 4 (Jul./Aug. 1985), pp. 1797-1803.

Primary Examiner—G. L. Kaplan
Attorney, Agent, or Firm—Armstrong, Nikaido, Marmelstein, Kubovcik & Murray

[57] ABSTRACT

A titanium nitride barrier layer of 50 to 200 nm in thickness is fabricated between a silicon substrate and an aluminum electrode layer of an IC device by reactive sputtering performed in a mixed gas including oxygen in a proportion of 1 to 5% by volume relative to other gases, comprising an inert gas and a reactive gas, providing the temperature of the silicon substrate at 350° to 550° C. during the reactive sputtering, so that the product has a failure rate, indicating the property of preventing mutual diffusion of silicon and aluminum atoms from occurring, of less than 1% and a resistivity less than 100 $\mu\Omega$.cm.

11 Claims, 6 Drawing Sheets

LEAKAGE CURRENT (A/CM²)

METHOD OF FORMING A BARRIER LAYER BETWEEN A SILICON SUBSTRATE AND AN ALUMINUM ELECTRODE OF A SEMICONDUCTOR DEVICE

BACKGROUND OF THE INVENTION (1) Field of the invention

The present invention relates to a barrier layer interposed between a silicon substrate and an aluminum electrode of a semiconductor device. The barrier layer is for preventing mutual diffusion of silicon and aluminum from occurring between the silicon substrate and the aluminum electrode.

In a semiconductor device, such as an integrated circuit (IC) device, contact resistance, which is generated at a metallic contact between a silicon substrate and a metallic electrode, must be as small as possible. As is well known, an insulating layer of silicon oxide layer is formed on the silicon substrate, and then a metallic contact is made between the metallic electrode and the silicon substrate at a contact area provided on the silicon substrate by removing the silicon oxide layer therefrom. Hitherto, aluminum has been commonly used as the metallic electrode because the aluminum can be easily deposited, as an aluminum film, on the silicon substrate so as to have a high adhesive strength with respect to the silicon oxide layer. However, there has been a problem that mutual diffusion of aluminum and silicon has occurred between the silicon substrate and the aluminum electrode (aluminum film). That is, silicon atoms from the silicon substrate and aluminum atoms from the aluminum film mutually diffuse into the aluminum film and the silicon substrate, respectively. Therefore, in a process of fabricating an IC device, the silicon in the silicon substrate tends to diffuse into the aluminum film and the aluminum in the aluminum layer tends to diffuse into the silicon substrate until the amount of the silicon diffused into the aluminum film and that of the aluminum diffused into the silicon substrate has increased up to the solubility limit at the temperature of fabricating the IC device. This mutual diffusion degrades the characteristics of IC device, producing "pits" at the interface between the silicon substrate and the aluminum film. For preventing this mutual diffusion, an aluminum film containing 1 to 2 weight percent (W %) of silicon has been used for the metal electrode, so that the mutual diffusion is stopped up to fabricating temperatures of less than 550° C. However, the fabricating temperature actually exceeds 550° C. during the several steps during fabricating the IC device, whereupon silicon migrates into the aluminum film. This silicon migration into the aluminum film occurs locally in limited regions, called contact holes or via holes, usually produced near the contact area. Since the migrated silicon has high resistivity, the contact area is effectively reduced, causing an increase in the contact resistance. The increased contact resistance can not be ignored in the IC device, particularly where the IC device is a large scale integrated (LSI) circuit device or a very large scale integrated (VLSI) circuit device.

(2) Description of the related art

To solve the above mutual diffusion problem, a barrier layer has been provided between the silicon substrate and the aluminum layer. Generally, the barrier layer is required to have the following characteristics:

(1) the mutual diffusion of the silicon atoms and the aluminum atoms is prevented, by the barrier layer, from passing through the interface between the silicon substrate and the aluminum layer, even at a high processing temperature (this property is called the "barrier property", hereinafter); and (2) the barrier layer has low resistivity and low contact resistance between the silicon substrate and the barrier layer and between the aluminum layer and the barrier layer.

Refractory metal compounds such as refractory metal nitrides, refractory metal carbides or refractory metal borides are used as the barrier layer. Such barrier layer is usually fabricated by a reactive sputtering technique using a refractory metal as a target and several kinds of gases. In reactive sputtering, the barrier layer is fabricated under various sputtering conditions. The conditions which are suitably varied include: partial pressure of reactive gas, electric power applied to the target, temperature of the silicon substrate, and electrostatic potential at the silicon substrate. Heretofore, there was a tendency for the properties of the barrier layer to be easily influenced by tiny differences in the sputtering conditions. In particular, it was very hard to repeatedly obtain an expected barrier property.

This problem has been ameliorated by annealing the barrier layer in an atmosphere of an oxygen containing gas after sputtering. The main reason for using an oxygen containing gas atmosphere has been because it was believed that, at high temperatures, oxygen produced oxide at grain boundaries in the barrier layer which prevented the mutual diffusion of silicon and aluminum from occurring through the grain boundaries. This is described in "Investigation of TiN Films for Diffusion Barrier in High Temperature Metallization" by Shuichi KANAMORI: in "Shinkuu" No. 29 (September, 1986).

However, there is still another problem in that the properties of the annealed barrier layer have poor reproducibility because of contamination in the barrier layer occurring during the change from the sputtering to the annealing steps. Usually, the sputtering and the annealing are individually performed in a vacuum chamber of a reactive sputtering apparatus and in an annealing furnace, respectively. The sputtering is usually accomplished on only one wafer (which produces a number of IC tips) at a time and each sputtering takes about 1 to 2 minutes. The annealing, however, can be performed on approximately 50 wafers at a time but takes about 50 minutes. Therefore, during the transfer of the wafer from the sputtering step to the annealing step, the wafer is taken out of the vacuum chamber and the barrier layers may be contaminated by the dust and gas in the air, which causes the properties of the barrier layers to change resulting in low reproducibility of the expected property of the barrier layer.

The problem of contamination might be solved if the wafer did not need to be transferred from the vacuum chamber to the annealing furnace. This has been attempted in two ways both of which use only one vacuum chamber for both sputtering and annealing. One of the two ways, which will be called a "first way" hereinafter, was by, after sputtering, only raising the temperature of the silicon substrate, which will be called a "substrate temperature" hereinafter, in the vacuum chamber without adding oxygen; and the other, which will be called a "second way" hereinafter, was to carry out the sputtering in an atmosphere including a very small percentage of oxygen, but without raising the substrate temperature.

The first way is disclosed in a technical paper, called "Ref. (1)" hereinafter, titled "THE PROPERTIES OF REACTIVE SPUTTERED TIN FILMS FOR VLSI METALLIZATION", by the present inventor and others, on p. 205-211 a publication for "VLSI Multilevel Interconnection (V-MIC) Conference" held in June 13-14, 1988. According to Ref. (1), when the barrier layer is formed by reactive sputterinq at high substrate temperature in a vacuum chamber, the density of a formed barrier layer increases as the substrate temperature increases, which is shown in FIG. 1 of this application. That is, as shown in FIG. 1, the density of the titanium nitride (TiN) barrier layer increases up to approximately 4.75 g·cm$^{-3}$ when the substrate temperature is raised to 600° C., which is equal to an increase in the density of TiN of 15% when the substrate temperature is increased from 25° C. to 600° C. This increase in density may be due to enhancing the crystallization of the TiN as the substrate temperature increases. Because of this increase in density, the barrier property of the barrier layer increases. FIG. 1 also shows that the resistivity of a TiN layer decreases, to approximately 35 $\mu\Omega$·cm, when the substrate temperature is raised up to 600° C., which is about ⅓ of its resistivity decrease at 25° C.

Ref. (1) also shows a relationship between the rate of failure of the barrier layer and the substrate temperature. The failure rate is a newly provided property devised by the inventor for quantitatively evaluating the barrier property. According to Ref. (1), a pattern of a number of via holes, which is usually called a Test Element Group (TEG), is previously formed on a test substrate consisting of a silicon substrate and an aluminum layer formed on the silicon substrate through a barrier layer of TiN. This is for testing whether the barrier layer failures are caused by via holes created by the mutual diffusion of aluminum and silicon, by observing the failure state of the via holes through a microscope and counting the number of failed via holes. Then, the failure rate is defined as the ratio of the number of failured via holes to the total number of via holes. (The failure rate will be also used in the explanation of the present invention hereinafter.) According to Ref. (1), the failure rate decreases as the substrate treatment temperature increases. However, it has been found that it is hard to decrease the failure rate to less than a value of 1% at 600° C. of the substrate temperature. (In the fabrication of IC devices, it is not desirable to raise the substrate temperature to more than 600° C.)

The second way is disclosed in Japanese laid-open application, SHO 59-182208, filed on Mar. 31, 1983 by Takeuchi et al. It has been well known that an oxygen containing gas has been used for increasing the barrier property. However, according to the laid-open application by Takeuchi et al., the presence of oxygen has the disadvantage of increasing the resistivity of the barrier layer. Therefore, the laid-open application discloses that the flow rate of the oxygen gas should be less than 1% in order to keep the resistivity at a value of less than 300 $\mu\Omega$·cm. However, in the laid-open application, the substrate temperature is room temperature and nothing is shown about increasing the substrate temperature.

As a result, in the art related to barrier layers, it is practically known that: raising the substrate temperature is effective for decreasing the resistivity and the failure rate, however, it has been impossible to decrease the failure rate to less than 1%; and using an oxygen containing gas during the reactive sputtering is effective in decreasing the failure rate, however, the oxygen causes the resistivity of the barrier layer to increase, so that the proportion of the oxygen gas must be limited to less than 1% to keep the resistivity at less than 300 $\mu\Omega$·cm. Therefore, it has been believed by those skilled in the art that while a barrier layer must be used for avoiding the problems of mutual diffusion, however, there is still a big problem in that it is almost impossible to expect the barrier layer to decrease the failure rate to less than 1% unless the substrate temperature has been raised more than 600° C. or the resistivity is allowed to be more than 300 $\mu\Omega$·cm. However, in IC devices, particularly in the case of LSI or VLSI device, a substrate temperature of more than 600° C. and/or a resistivity more than 300 $\mu\Omega$·cm are impermissible. Furthermore, in the case of LSI or VLSI devices, the failure rate is strongly required to be less than 1%.

SUMMARY OF THE INVENTION

Therefore, an object of the present invention is to improve the characteristics of the barrier layer so as to simultaneously decrease the failure rate and the resistivity of the barrier layer without raising the substrate temperature to higher than 600° C.

Another object of the present invention is to improve the fabrication reliability of the aluminum electrodes formed on the silicon substrate, with an interposed barrier layer, in the process of fabricating the IC devices.

Still another object of the present invention is to improve the product reliability of IC devices having aluminum electrodes formed on silicon substrates with an interposed barrier layer.

The above objects are achieved by improving the reactive sputtering method of fabricating a barrier layer on a silicon substrate by performing the sputtering with an oxygen containing gas flowing into the vacuum chamber of a conventional reactive sputtering apparatus, and simultaneously raising the temperature of the silicon substrate.

That is, according to the present invention, reactive sputtering for fabricating a barrier layer on a silicon substrate is performed by flowing an oxygen containing gas, at 5% proportion, into the vacuum chamber, in combination with the usual gases, including an inert gas (such as argon) and a reactive gas, such as at least one of nitrogen gas, a nitrogen compound gas, a carbon compound gas, and a boron compound gas; and simultaneously raising the substrate temperature as much as 200° C. to 600° C., sufficient to form a barrier layer of a refractory metal compound, such as titanium nitride, titanium carbide or titanium boride, on the silicon substrate using a refractory metal, such as titanium, as a target for the sputtering. After thus forming the barrier layer, an aluminum or aluminum alloy film, comprising the electrode, is formed on the barrier layer.

The TiN barrier layer is composed of many grains of titanium nitride, producing many grain boundaries. The average diameter of the grains depends on the substrate temperature during the sputtering process so that the average grain diameter becomes larger as the substrate temperature increases. Therefore, the total area of grain boundaries decreases as the substrate temperature increases. Oxygen atoms are easily trapped at the grain boundaries, producing titanium oxide. This titanium oxide produced at the grain boundaries causes an increase in the resistivity of the barrier layer, improving the barrier property of the barrier layer. Therefore, when the substrate temperature is raised, a small amount of oxygen containing gas is enough to obtain the same effect as using a large amount of oxygen gas at a low substrate temperature. Therefore, the resistivity of the barrier layer, which is fabricated at a higher substrate temperature, does not increase over that produced at a substrate temperature of 25° C., even though a larger amount of oxygen gas is used.

According to an experiment by the present inventor, the failure rate was decreased so as to be less than 1% when the oxygen proporation was 2% and the substrate temperature was kept between 260° to 550° C. The resistivity of the barrier layer fabricated under these conditions was less than 100 $\mu\Omega$·cm.

To evaluate the reactive sputtering method of the present invention, a diode composed of an aluminum electrode formed on a silicon substrate through a TiN barrier layer was prepared, and heat treatment of the diode was performed at 480° C. for 90 min. The leakage current of the diode was measured before and after the heat treatment. As a result, it has been confirmed that there was no difference of the leakage current before and after the heat treatment. This means that the heat resisting property of the barrier layer is high enough. In other words, no mutual diffusion occurs in the actual usage of the diode having a TiN barrier layer made according to this invention.

BRIEF DESCRIPTION OF THE DRAWINGS

FIG. 8(b) is a histogram of the leakage current of the diode after heat treatment when a barrier layer formed in the diode is fabricated with an oxygen gas flow rate of 4 sccm and a substrate temperature of 550° C.

DESCRIPTION OF THE PREFERRED EMBODIMENT

A method for forming a barrier layer on a silicon substrate by a reactive sputtering technique, an application of the barrier layer to an aluminum electrode and the characteristics of the barrier layer will be described with reference to FIGS. 3 to 8.

Figure 1:
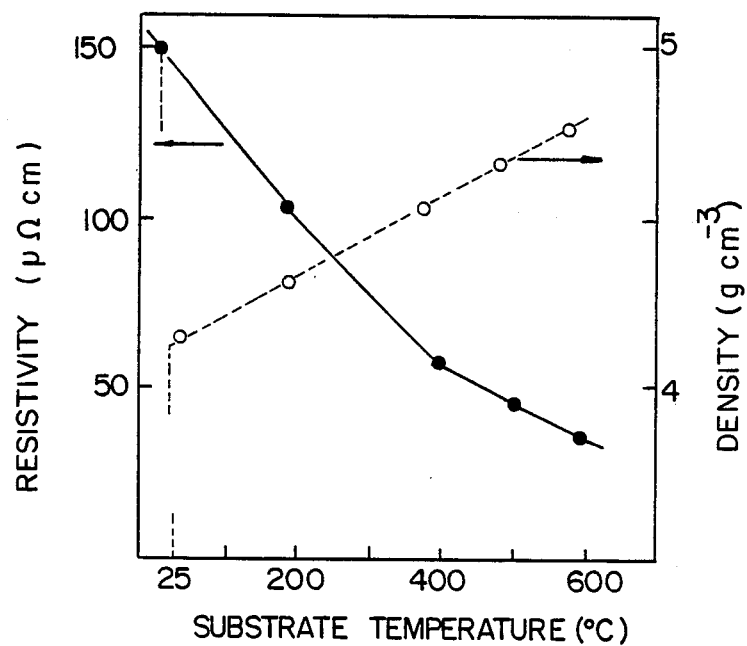
FIG. 1 is a graph showing the influence of a substrate temperature on the density and the resistivity of a TiN barrier layer.
Figure 2:
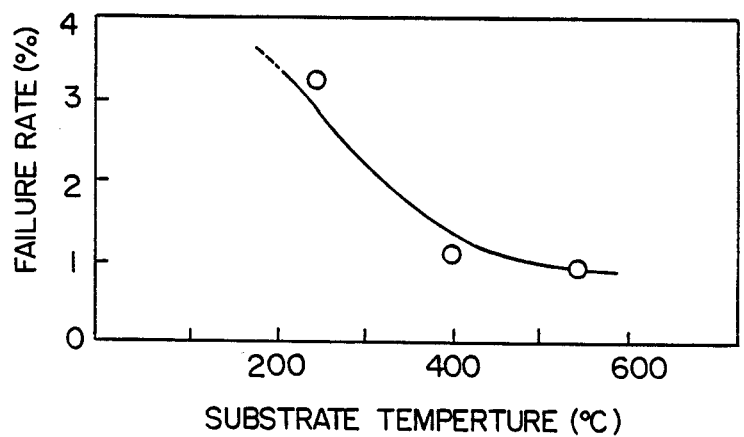
FIG. 2 is a graph showing the variation in the failure rate of a barrier layer as a function of the change of the substrate temperature.
Figure 3:
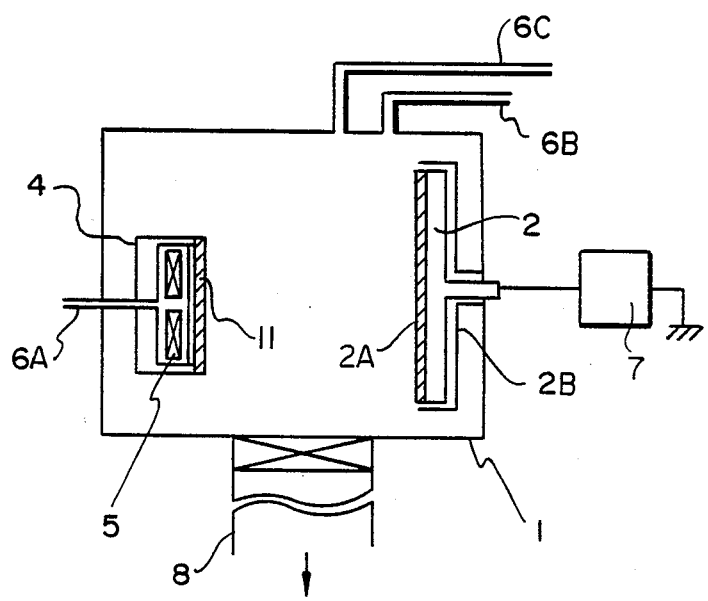
FIG. 3 is a schematic drawing of a conventional reactive sputtering apparatus used for fabricating a barrier layer.

FIG. 3 shows a schematic drawing of a conventional reactive sputtering apparatus, useful in a reactive sputtering method embodying the present invention, for forming a barrier layer. A vacuum chamber 1, made of stainless steel for instance, contains an electrode 2 and a sample holder 4. On the electrode 2, a target 2A, made in the form of a disk having a diameter of, for example, 8 inches and composed of a refractory metal such as titanium (Ti) of four nines purity, is fixed. The electrode 2 has an electric shield 2B connected to the vacuum chamber 1 for obtaining the same electric potential as that of the electrode 2. On the sample holder 4, a silicon substrate 11, having a diameter of 4 inches, is fixed for forming a barrier layer thereon such that a surface of the silicon substrate 11 faces toward a surface of the titanium target 2A at an adequate distance, for instance, 5.5 cm. The silicon substrate 11 is maintained at 350° C. by using a heater 5, however the temperature of the substrate can be adjusted up to 600° C.

The process is carried out by evacuating the vacuum chamber 1 to a high vacuum by a vacuum pump, not depicted, through an exhaust tube 8. Then, three kinds of gases are introduced into the vacuum chamber 1 through three gas inlets 6A, 6B and 6C and mixed in the vacuum chamber 1. The mixed gas is also exhausted through the exhaust tube 8. Total pressure of the mixed gas is kept at 1-5 mm Torr. An inert gas such as argon gas is introduced through the gas inlet 6A. Nitrogen gas, as a reactive gas, is introduced through the gas inlet 6B when titanium nitride (TiN) is to be formed as the barrier layer. Oxygen containing gas is introduced through the gas inlet 6C. The proportions of argon, nitrogen and oxygen are 20-48%, 50-75% and 2-5% respectively. When a negative high voltage of 400-500 V is applied to the electrode 2 from a DC electric power source 7, plasma is generated between the electrode 2 and the silicon substrate 11.

Figure 4A:
FIG. 4(a) is a schematic cross-sectional view of a silicon substrate.
Figure 4B:
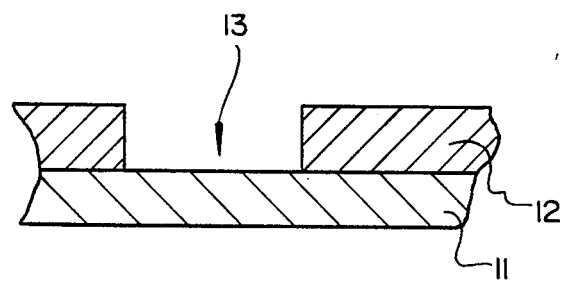
FIG. 4(b) is a schematic cross-sectional view of a silicon substrate and an insulating layer formed on the silicon substrate, providing a contact hole.
Figure 4C:
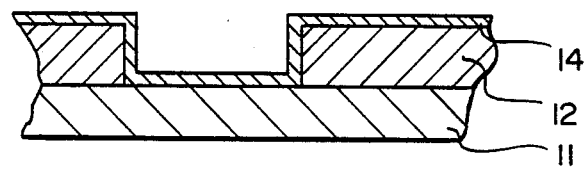
FIG. 4(c) is a schematic cross-sectional view of the silicon substrate of FIG. 4(b) modified by forming a contact layer thereon.

Next, the steps of fabricating an aluminum electrode will be described with reference to FIGS. 4(a) to 4(e). FIG. 4(a) shows a silicon substrate 11 on which an aluminum electrode 4 will be formed. An insulating layer 12, for example composed of silicon dioxide or phosphosilicate glass (PSG), is formed on the silicon substrate 11, and a contact hole 13 for making electrical contact between the aluminum electrode 16 and the silicon substrate is formed in the insulating layer 12 by conventional lithography. The sample in FIG. 4(b) will be called a first silicon substrate hereinafter. Then, in order to obtain a good ohmic contact between the aluminum electrode and the silicon substrate 11, a contact layer 14 is formed on the silicon substrate 11 covering the silicon surface in the contact hole 13 and on the insulating layer 12 as shown in FIG. 4(c). This contact layer 14 is a thin layer, of about 10 nm in thickness, and is composed for example of titanium, aluminum or doped polysilicon. The contact layer 14 does not have any barrier property at all. The properties of the contact layer have been disclosed by the present inventor in Japanese patent publication No. SHO 62-165795, published on July 2, 1987. The sample shown in FIG. 4(c) will be called a second silicon substrate hereinafter.

Figure 4D:
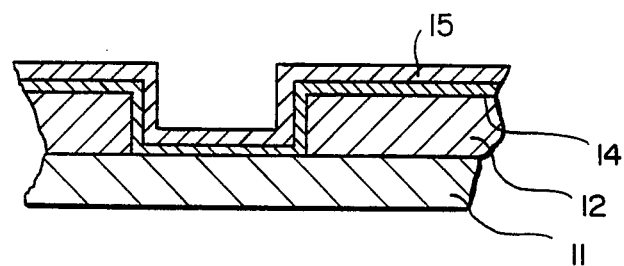
FIG. 4(d) is a schematic cross-sectional view of the article of FIG. 4(c) having a barrier layer formed thereon.
Figure 4E:
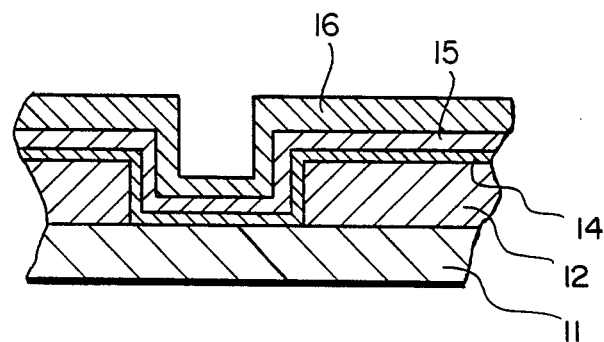
FIG. 4(e) is a schematic cross-sectional view of the article of FIG. 4(d) having an aluminum electrode formed thereon.

The second silicon substrate is placed in the sample holder 4 in the vacuum chamber 1 shown in FIG. 3. DC power of 3-7 KW is supplied to the titanium target 2A, whereupon the titanium target 2A is sputtered by the plasma, so that the sputtered titanium reacts with the nitrogen gas. As the result, a titanium nitride barrier layer 15 is deposited on the contact layer 14 having a thickness of 50-200 nm, as shown in FIG. 4(d). Finally, an aluminum or aluminum alloy electrode layer 16 is deposited on the barrier layer 15 by a conventional technique, as shown in FIG. 4(e).

The contact layer 14, the barrier layer 15 and the electrode layer 16 are patterned so as to form a definite electrode and wiring of an IC device, not depicted. As seen from FIG. 4(e), the aluminum electrode layer 16 is connected to the silicon substrate 11 through the barrier layer 15 and the contact layer 14.

In this embodiment, titanium is used as the target, however other refractory metals, such as tantalum (Ta), zirconium (Zr), hafnium (Hf), tungsten (W), or molybdenum (Mo) can be used instead of titanium. The following materials can be used for the barrier layer other than titanium nitride (TiN): with a titanium target: titanium carbide (TiC), titanium boride (TiB); with a tantalum target; tantalum nitride (TaN), tantalum carbide (TaC) and tantalum boride (TaB), with a zirconium target: zirconium nitride (ZrN), zirconium carbide (ZrC) and zirconium boride (ZrB), with a hafnium target; hafnium nitride (HfN), hafnium carbide (HfN) and hafnium boride (HfB), with a tungsten target; tungsten nitride (WN), tungsten carbide (WC) and tungsten boride (WB), with a molybdenum target, molybdenum nitride (MoN), molybdenum carbide (MoC) and molybdenum boride (MoB).

In order to form a barrier layer composed of a nitrogen compound, a carbon compound or a boron compound, a nitrogen compound gas such as ammonium gas ($NH_3$), a carbon compound gas such as methane ($CH_4$) or a boron compound gas such as diborane ($B_2H_6$) can be used, respectively, instead of the nitrogen gas.

After forming the aluminum electrode layer 16, an extra heat treatment was required for improving the characteristics of the barrier layer in the prior art. However, by applying the method of the present invention to the reactive sputtering technique, this heat treatment is no longer required.

As stated before, the oxygen gas in the vacuum chamber played an important role in enhancing the barrier property of the barrier layer; however, the use of the oxygen gas had the disadvantage that it simultaneously increased the resistivity of the barrier layer. Regarding this disadvantage, systematic experiments were carried out to determine the influence of the oxygen on the resistivity of the barrier layer.

Figure 5:
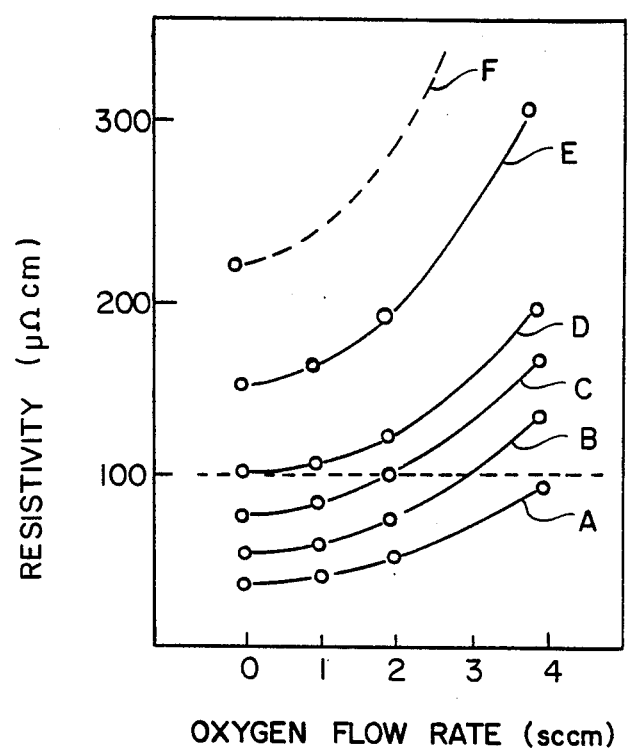
FIG. 5 is a graph showing a relationship between the resistivity of a barrier layer and the proportion of oxygen in the gas which flows during the reactive sputtering, as a function of the substrate temperature.

FIG. 5 shows the relationship between the resistivity of the barrier layer and the flow rate of the oxygen gas as a function of changing the substrate temperature. The oxygen flow rate is equivalent to the volume percentage of oxygen gas, since the total flow rate is set at 100 sccm. In FIG. 5, five experimental curves A, B, C, D and E are provided by connecting measured points of resistivity corresponding to the flow rates 0, 1, 2 and 4 sccm of oxygen gas respectively, and the curve F is an estimation, based on a measured resistivity corresponding to "0" flow rate, showing how the resistivity would vary if the flow rate of the oxygen gas changed from 0 to 4. The curves A, B, C, D, E, and F correspond to substrate temperature 550° C., 410° C., 260° C., 125° C. and 25° C., respectively. As seen from these curves A, B, C, D, E, and F, the resistivity of the barrier layer increases as the proporation of oxygen increases. It is concluded that: when the proportion of oxygen is constant, the resistivity of the barrier layer becomes small as the substrate temperature is raised; and when the resistivity of the barrier layer is constant, the substrate temperature becomes high as the proportion increases.

It can be found from the curves A, B and C in FIG. 5 that if the proportion of the oxygen gas and the substrate temperature are set so as to be less than 4 sccm and higher than 350° C. respectively, a barrier layer having a resistivity having a value smaller than 100 $\mu\Omega$·cm can be achieved.

Figure 6:
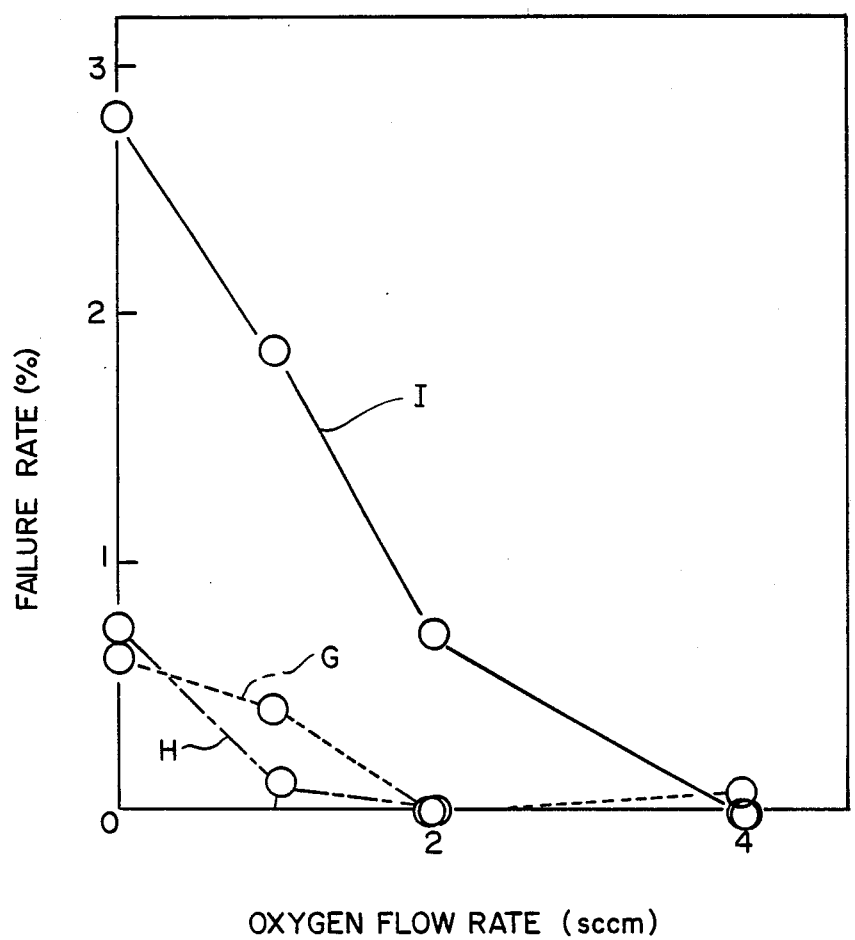
FIG. 6 is a graph showing a relationship between the failure rate of a barrier layer and the proportion of oxygen in the gas which flows during the reactive sputtering, as a function of the substrate temperature.

FIG. 6 shows the failure rates achieved at various proportions of oxygen, as a function of three substrate temperatures. Curves G, H and I in FIG. 6 correspond to the substrate temperatures 260° C., 410° C., and 550° C. respectively. The barrier property of the barrier layer is measured, using the same test pattern as used in Ref. (1). In this test pattern, three thousand via holes are provided on a silicon substrate, and the via holes are observed with an optical microscope. If at least one etch pit is observed in a via hole, the via hole is counted as a failed via hole. The number of failed via holes is counted, so that the failure rate is obtained as a percentage of the failed via holes in a total of three thousand via holes. As seen from FIG. 6, the failure rate becomes smaller as the proportion of the oxygen increases. It can be found from the curve I in FIG. 6 that when the substrate temperature is 260° C., a failure rate of 3% at 0 sccm of flow rate decreases to a failure of almost 0 as the flow rate increase from 0 to 4 sccm. When the substrate temperatures is raised to 410° C. or 550° C., the failure rates become 0% when the flow rate of the oxygen gas exceeds 2 sccm, as shown by curves G and H respectively.

In order to verify whether the mutual diffusion of aluminum and silicon occurs in a TiN barrier layer fabricated as described with reference to FIG. 3, the heat resisting property of an aluminum electrode including a TiN barrier layer was measured by heat treatment in a vacuum environment at 480° C. for 90 min. As a result, it was confirmed that the mutual diffusion did not occur. This fact was confirmed by measuring the leakage current of the diode shown in FIG. 7.

Figure 7:
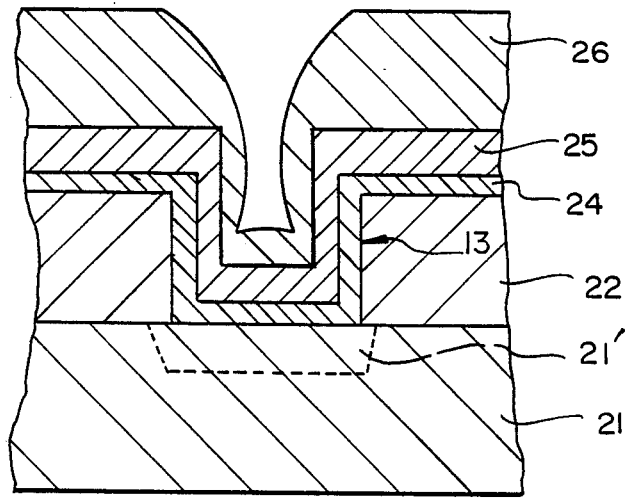
FIG. 7 is a schematic cross-sectional view of a diode of FIG. 7 comprising an aluminum electrode, a TiN barrier layer and an n-type region in a p-type silicon substrate.

FIG. 7 shows a schematic cross-sectional view of a diode which has an aluminum electrode as shown in FIG. 4. A plurality of diodes, each being the same as the diode shown in FIG. 7, were fabricated in a test pattern in the same way as was used for the measurement of the failure rate. The diode has a p-n junction fabricated by arsenic ion implantation into a p-type silicon substrate 12, using an energy of 70 KeV and a dose of $4 \times 10^{15} cm^{-2}$. An n-type region 21' was formed in the p-type silicon substrate 21 so as to have a thickness of 0.34 $\mu$m, by ion implantation, as indicated by the dotted line in FIG. 7. A contact hole 13, having a diameter of 1.2 $\mu$m, is provided in a silicon dioxide layer 22 having a thickness of 1.0 $\mu$m. A contact layer 24 composed of titanium having a thickness of 20 nm is formed on both the n-type region 21' and the silicon dioxide layer 22, followed by forming a TiN barrier layer 25 and an Al electrode layer 26 so as to have a thickness of 0.1 μm and 1.0 μm, respectively. Then the heat treatment of the diode is performed in a vacuum environment at 480° C. for 90 min.

Figure 8A:
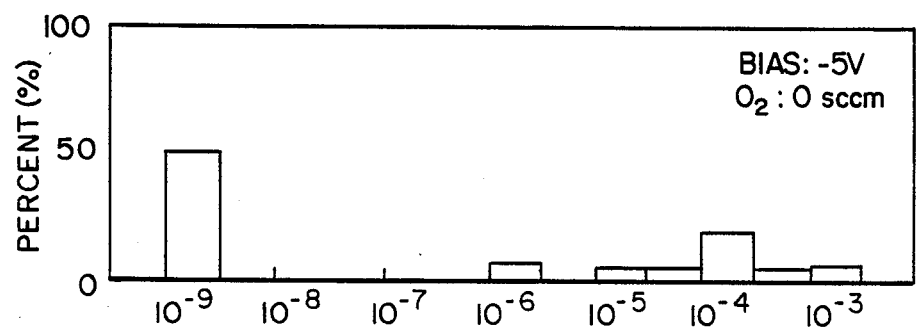
FIG. 8(a) is a histogram of the leakage current of the diode after heat treatment when a barrier layer formed in the diode is fabricated under oxygen free conditions.
Figure 8A:
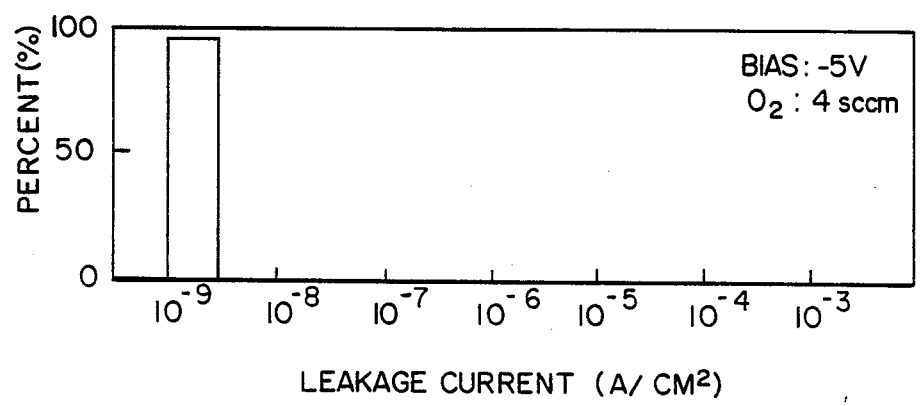

The leakage current is measured under a reverse bias or 5 V for all diodes in the test pattern. FIGS. 8(a) and 8(b) histograms show the results of the measurement of the leakage current. FIG. 8(a) shows a histogram of the leakage current of the diodes each having a barrier layer fabricated under a condition of no added oxygen and 550° C. substrate temperature. It is seen in FIG. 8(a) that the leakage current of the diodes is scattered from $10^{-9}$ to $10^{-3}$ A cm$^{-2}$. It is considered that the scatter of the leakage current is caused by damage to the regions near the p-n junction caused by the mutual diffusion of aluminum and silicon occurring during the heat treatment. FIG. 8(b) shows a histogram of the leakage current of the diodes which include a barrier layer fabricated according to this invention at 4 sccm oxygen flow rate and 550° C. substrate temperature. As shown in FIG. 8(b), the leakage current of the diodes is concentrated at a value of $10^{-9}$ A cm$^{-2}$. The leakage current was not scattered, which means that the regions near by the p-n junction were not damaged by the mutual diffusion of aluminum and silicon which was suppressed by the barrier layer.

What is claimed is:

1. A method of forming an electrode layer, comprising aluminum, on a substrate, comprising silicon, comprising:
   forming an insulating layer on said substrate, which insulating layer has at least one contact hole therein exposing said silicon and adapted to receive said electrode on said silicon therethrough thereby producing a first substrate;
   exposing said first substrate to reactive sputtering with a refractory metal target in an environment comprising, a mixed gas comprising an inert gas, a reactive gas comprising a gas selected from nitrogen, a nitrogen compound, a carbon compound and a boron compound, and oxygen at a temperature of about 350° to 600° C., thereby producing a second substrate containing a high density barrier layer refractory metal compound thereon comprising a reaction product of said reactive gas and said refractory metal, wherein the quantity of oxygen in said mixed gas is sufficient to create refractory metal oxide at the grain boundaries in said barrier layer in an amount sufficient to decrease the failure rate thereof but insufficient to significantly increase the resistivity thereof; and
   forming a layer, comprising aluminum, on said barrier layer at least in said hole.

2. A method as claimed in claim 1 further comprising forming a contact layer at least in said contact hole on said first silicon substrate comprising at least one member selected from the group consisting of titanium, polysilicon, aluminum and aluminum alloy, thereby forming an ohmic contact between said first silicon substrate and said barrier layer.

3. A method as claimed in claim 1, wherein said refractory metal is selected from at least one member of the group consisting of titanium, zirconium, hafnium, tantalum, tungsten and molybdenum.

4. A method as claimed in claim 1, wherein said insulating layer is at least one selected from the group consisting of silicon dioxide, phosphosilicate glass, silicon nitride and borophosilicate glass.

5. A method as claimed in claim 1 wherein said oxygen level is about 1–5 volume percent of said mixed gas.

6. A method as claimed in claim 1 wherein the proportion of oxygen is such that the resistivity of the high density barrier layer is less than 100 m ohm/cm.

7. A method of forming an aluminum or aluminum alloy electrode layer on a silicon substrate; said method comprising the steps of:
   forming an insulating layer, having a contact hole for contacting the electrode layer with the silicon substrate, on the silicon substrate thereby producing a first silicon substrate;
   forming a contact layer, comprising titanium, on said first silicon substrate having a thickness less than 20 nm thereby producing a second silicon substrate;
   placing said second silicon substrate in a reactive sputtering means;
   placing a target composed of titanium metal in said reactive sputtering means;
   supplying a mixed gas consisting of argon, a gas comprising nitrogen and oxygen to said reactive sputtering means;
   controlling the temperature of said second silicon substrate to between about 350° C. and 600° C.;
   performing reactive sputtering by said reactive sputtering means thereby forming a high density barrier layer, consisting of titanium nitride produced during said reactive sputtering, on said second silicon substrate, said mixed gas comprising sufficient oxygen to cause sufficient titanium oxide to be produced at the grain boundaries in said barrier layers to reduce the failure rate thereof but insufficient to substantially increase the resistivity thereof, said barrier layer effectively preventing silicon atoms in the silicon substrate from diffusing into the aluminum electrode and aluminum atoms in the aluminum electrode from diffusing into the silicon substrate, and said contact layer causing said barrier layer to effectively contact said silicon substrate; and
   forming an aluminum or aluminum alloy layer on said barrier layer.

8. A method as claimed in 7, wherein said oxygen gas used in said step of supplying a mixed gas, is about 1–5% in volume of said mixed gas.

9. A method as claimed in 7, wherein said insulating layer is selected from the group consisting of silicon dioxide, a phosphosilicate glass, silicon nitride and a borophosilicate glass.

10. A method according to claim 7, wherein said barrier layer, formed in said step of performing the reactive sputtering, has a thickness of about 50 nm to 200 nm.

11. A method as claimed in claim 7 wherein the proportion of oxygen in the mixed gas and the temperature of sputtering are such that the resistivity of the formed barrier layer is less than 100 m ohm/cm.

* * * * *